(12) United States Patent
Oh et al.

(10) Patent No.: US 7,688,870 B2
(45) Date of Patent: Mar. 30, 2010

(54) OPTICAL AMPLIFIER-INTEGRATED SUPER LUMINESCENT DIODE AND EXTERNAL CAVITY LASER USING THE SAME

(75) Inventors: Su Hwan Oh, Daejeon (KR); Jung Jin Ju, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 49 days.

(21) Appl. No.: 12/182,543

(22) Filed: Jul. 30, 2008

(65) Prior Publication Data
US 2009/0154514 A1    Jun. 18, 2009

(30) Foreign Application Priority Data
Dec. 18, 2007    (KR) .................... 10-2007-0133553

(51) Int. Cl.
*H01S 3/00* (2006.01)
*H01S 5/00* (2006.01)
(52) U.S. Cl. ........................... 372/1; 372/50.22
(58) Field of Classification Search ............ 372/1, 372/50.1, 50.22
See application file for complete search history.

(56) References Cited

U.S. PATENT DOCUMENTS 7,046,435 B2    5/2006   Shin et al.

OTHER PUBLICATIONS

Liu et al., "High-Power 1.5 μm InGaAsP/InP Strained Quantum Wells Integrated Superluminescent Light Source with Tilted Structure", Jpn. J. Appl. Phys., vol. 40, 2001, pp. 4009-4010.
Okamoto et al., "Narrow-beam 1.3 μm superluminescent diode with butt-jointed selectively grown spot size converter", Electronics Letters, vol. 33, No. 9, Apr. 24, 1997, pp. 811-812.

*Primary Examiner*—Armando Rodriguez
(74) *Attorney, Agent, or Firm*—Rabin & Berdo, PC

(57) ABSTRACT

Provided is a super luminescent diode having low power consumption due to low threshold current and a high output power in low-current operation, which is suitable for an external cavity laser. The super luminescent diode for use in the external cavity laser is divided into a super luminescent diode (SLD) region and a semiconductor optical amplifier (SOA) region to provide a light source having a low threshold current and a nearly double output power of a conventional SLD.

A super luminescent diode-integrated reflective optical amplifier includes a substrate that has a super luminescent diode (SLD) region and a semiconductor optical amplifier (SOA) region for amplifying light generated from the SLD region, an optical waveguide that has a buried heterostructure, the buried heterostructure including an active layer extending over the SLD and SOA regions on the substrate and tapered in the SOA region; a current blocking layer formed around the active layer for blocking a current flow to layers other than the active layer, the current blocking layer including a stack of semiconductor layers having different conductivity types; and a clad layer formed on the optical waveguide and the current blocking layer.

16 Claims, 4 Drawing Sheets

OPTICAL AMPLIFIER-INTEGRATED SUPER LUMINESCENT DIODE AND EXTERNAL CAVITY LASER USING THE SAME

CROSS-REFERENCE TO RELATED APPLICATION

This application claims priority to and the benefit of Korean Patent Application No. 2007-133553, filed Dec. 18, 2007, the disclosure of which is incorporated herein by reference in its entirety.

BACKGROUND

1. Field of the Invention

The present invention relates to a super luminescent diode, and more particularly, to a 2-section super luminescent diode in which a super luminescent diode and an optical amplifier are formed as a single platform.

This work was supported by the IT R&D program of MIC/IITA [2006-S-073-02, Nano flexible opto-electric PCB module for portable display].

2. Discussion of Related Art

To construct a cost-effective Wavelength Division Multiplexing (WDM) subscriber network system, it is essential to develop a stable and cost-effective light source. Particularly, as every subscriber in the WDM subscriber network system is assigned a specific wavelength for communication, it is necessary to have a wavelength-independent light source capable of providing the same light source to the subscribers regardless of the assigned wavelength.

Various wavelength-independent light sources have been actively studied, such as a wavelength locked Fabry Perot-laser diode (WLFP-LD), a reflective semiconductor optical amplifier (RSOA), and a planar light wave circuit-external cavity laser (PLC-ECL).

A re-modulation structure employing the WLFP-LD and the RSOA has disadvantages of being dependent upon properties of the light source and being limited to a data rate of 1.25 Gb/s for direct modulation.

Accordingly, the PLC-ECL has drawn attention as a light source of a WDM optical subscriber network because of being cost-effective and having possibility of over 2.5 Gb/s transmission by direct modulation.

The grating of ECL structure is formed on silica and polymer waveguides on a silicon substrate and a semiconductor light source is hybrid integrated.

It is required for the semiconductor light source of the ECL not to oscillate with a reflectance of no more than 0.1% at an output facet and to have a high output in low current operation.

A Fabry Perot-laser diode (FP-LD) and a super luminescent diode (SLD) both meet these requirements. However, the SLD is widely used because of its wide bandwidth.

In a typical SLD, an active layer or an optical waveguide is tilted by 7 or 10 degrees to reduce a reflectance of an output facet. Even though such an SLD may have a reduced reflectance of the output facet, it is not suitable for a WDM-passive optical network (PON) due to increase in threshold current and operation current. Accordingly, research is actively underway into an SLD light source having properties comparable to a Fabry-Perot with anti-reflection and high reflection coatings.

Meanwhile, for a high-output SLD, integration of an SOA into the SLD has been researched. Recent research has revealed that the SLD integrated with SOA nearly doubles the output power of the SLD. Such an SLD is inappropriate for a PLC-ECL and particularly a PLC-ECL for a WDM-PON because of its overly high threshold current.

Thus, there is need for an SLD with a lower threshold current and a nearly double output of a typical SLD.

SUMMARY OF THE INVENTION

The present invention is directed to a light source with a low threshold current and a nearly double output of a conventional SLD by a super luminescent diode (SLD) monolithically integrated with a semiconductor optical amplifier (SOA), which is a light source for a planar light wave circuit-external cavity laser (PLC-ECL).

The present invention is also directed to an integrated device having an excellent high-frequency modulation characteristic of over 1.25 Gbp/s by a super luminescent diode (SLD) monolithically integrated with a semiconductor optical amplifier (SOA), and to an external cavity laser using the device.

Other objects of the invention will be understood in the following description and exemplary embodiments thereof.

One aspect of the present invention provides a super luminescent diode (SLD) monolithically integrated with a semiconductor optical amplifier (SOA), including: a substrate having both an SLD region and a semiconductor optical amplifier (SOA) region, which is amplifying light generated from the SLD region; an optical waveguide having a buried heterostructure, the buried heterostructure including an active layer extending over the SLD and SOA regions on the substrate and tapered in the SOA region; a current blocking layer formed around the active layer for blocking a current flow to layers other than the active layer, the current blocking layer including a stack of semiconductor layers having different conductivity types; and a clad layer formed on the optical waveguide and the current blocking layer.

The diode may further include a passive waveguide layer formed between the substrate and the optical waveguide, the active layers in the SLD region and the SOA region may include heterogeneous active layers, and the optical waveguide may have a ridge structure having a narrow width in the SOA region.

Another aspect of the present invention provides an external cavity laser comprising the optical amplifier-integrated super luminescent diode of claim 1 mounted as a TO can in a planar lightwave circuit (PLC).

Still another aspect of the present invention provides an external cavity laser comprising the SLD integrated with SOA of claim 1 mounted as a flip-chip in a planar lightwave circuit (PLC).

The PLC may include a Bragg grating formed on an optical waveguide of the PLC, and a heater electrode for controlling the temperature of the Bragg grating.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Figure 1:
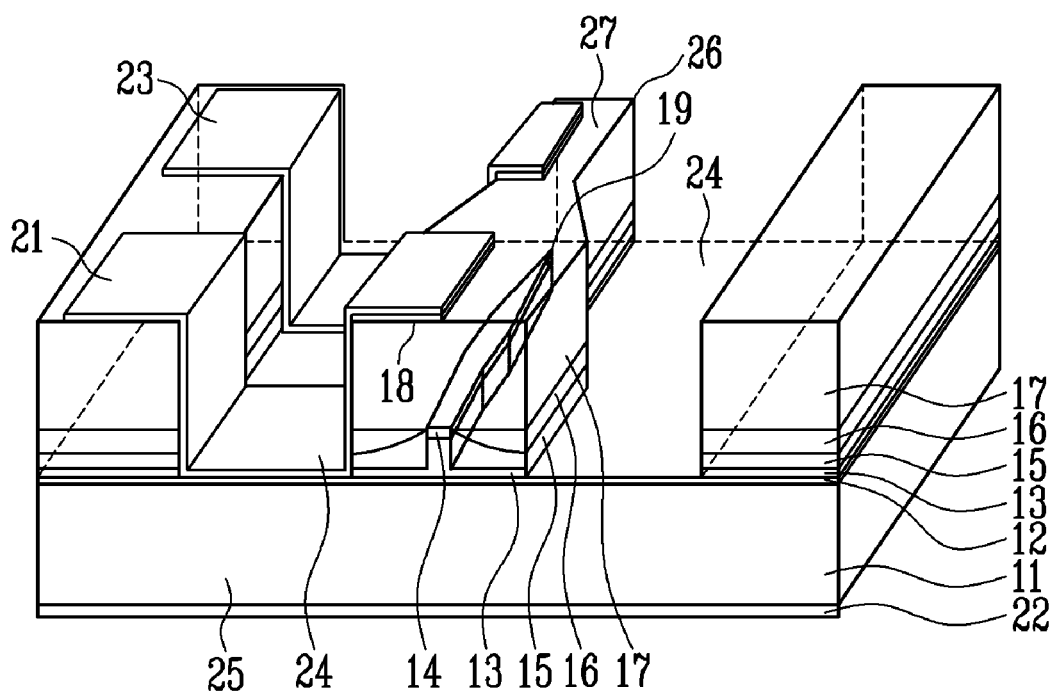
FIG. 1 is a schematic view of a 2-section SLD according to an exemplary embodiment of the present invention.

Hereinafter, exemplary embodiments of the present invention will be described in detail with reference to the accompanying drawings. The exemplary embodiments can be modified in various ways and are not intended to determine the scope of the present invention, but rather to enable those skilled in the art to embody and practice the present invention. The drawings are not necessarily to scale, emphasis instead being placed on illustrating the principles of the invention. Like elements are denoted by like reference numerals throughout.

An active layer of a super luminescent diode (SLD), which is used in a Wavelength Divisional Multiplexing passive optical network (WDM-PON) optical line terminal (OLT) and an optical network unit (ONU), and an active layer of a semiconductor optical amplifier (SOA) have the same structure of a growth layer and an optical waveguide except that the former has a structure of polarization-sensitive, compressive strain-compensated multiple quantum well (MQW) and the latter has a polarization-insensitive, strain-compensated bulk structure.

Thus, the present invention described hereinafter provides a light source having a lower threshold current and a double output power of a typical SLD by a SLD integrated with a SOA for use in a WDM-PON OLT and an ONU. Also, the present invention provides a device having an excellent high-frequency modulation characteristic of over 1.25 Gbp/s by SLD integrated with an SOA, and an external cavity laser using the device.

It is necessary to minimize a chip size of such a single integrated device for a lower threshold current. Accordingly, the SLD may be manufactured in a buried heterostructure (hereinafter, referred to as BH) because the BH exhibits a low current characteristic and high performance resulting from an excellent current blocking characteristic to layers other than an active layer over a buried ridge stripe (BRS).

In addition, a waveguide is tapered at its end in order to reduce internal reflection of the single integrated device, to increase an output, and to increase the size of an emitted light. Here, the narrower the width of the tapered end is, the better the property is.

The SLD with an SOA integrated according to the present invention will be referred to as a 2-section SLD for convenience of illustration and distinguishment from the conventional art.

Hereinafter, exemplary embodiments of the present invention will be described with reference to the accompanying drawings.

FIG. 1 is a schematic view of a 2-section SLD according to an exemplary embodiment of the present invention.

Referring to FIG. 1, the 2-section SLD according to an exemplary embodiment of the present invention includes an n-InP substrate 11, an n-type electrode 22 formed below the n-InP substrate 11, a passive waveguide 12 formed on the n-InP substrate 11, an optical waveguide formed on the passive waveguide 12, a p-type ohmic layer 18 formed on the optical waveguide, and a p-type SLD electrode 21 and a p-type SOA electrode 23 formed in an SLD region and an SOA region, respectively, at predetermined intervals on the p-type ohmic layer 18.

The optical waveguide includes BH-structured active layers 14 and 19 and a current blocking layer. The current blocking layer includes a p-InP current blocking layer 15 and an n-InP current blocking layer 16. Among the BH-structured active layers 14 and 19, the active layer 19 in the SOA region is tapered, and the active layer 14 in the SLD region is straight, but bent at its part abutting on the SOA region. The current blocking layers 15 and 16 block the flow of current to layers other than the active layers 14 and 19.

Meanwhile, portions of the current blocking layers 15 and 16 and the substrate 11 around the optical waveguide may be selectively etched to form a trench channel 24 in order to reduce parasitic capacitance in the vicinity of the active layers 14 and 19.

The optical waveguide may be formed in a ridge structure having a narrower SOA region in order to increase coupling efficiency with a silica waveguide or an optical fiber. The width of the ridge type waveguide can be adjusted by general photolithography and selective etching processes, allowing the size of the emitted light to be adjusted according to the ridge width. The width of the waveguide in the SOA region may range from 7 to 10 μm to maximize the coupling efficiency with the silica waveguide.

Meanwhile, a non-reflective coating 26 is formed on an output surface of the 2-section SLD to lower a reflectance, while a highly reflective coating 25 is formed on an input surface thereof to increase a gain.

Among the active layers 14 and 19, the active layer 14 in the SLD region is formed in a structure of a strain-compensated multiple quantum well (MQW), while the active layer 19 in the SOA region is formed in a polarization-insensitive, strain-compensated bulk structure.

Figure 2:
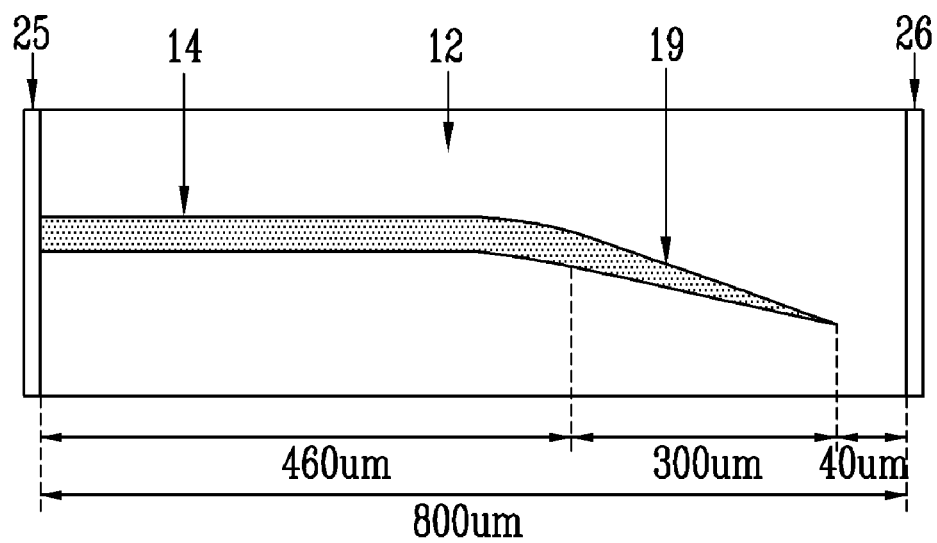
FIG. 2 is a cross-sectional view of an optical waveguide of the 2-section SLD in FIG. 1.

FIG. 2 is a cross-sectional view of the optical waveguide of the 2-section SLD in FIG. 1.

Referring to FIG. 2, the non-reflective coating 26 is formed on the output surface of the 2-section SLD according to the present invention to lower the reflectance, while the highly reflective coating 25 is formed on the input surface thereof to increase the gain of the device.

Meanwhile, a larger inclination angle of the waveguide reduces the reflectance of the incident/emitting surfaces and a large loss in the bent waveguide region reduces the gain. To minimize the loss, the passive waveguide 12 is formed below the active layer. This contributes to increase in light coupling efficiency.

In the present invention, the width of the active layer ranges from 1 to 1.5 μm, and a width from the bent waveguide portion to the tapered end decreases from 1 to 1.5 μm to 0.1 μm or less for mode size conversion.

In FIG. 2, the overall waveguide is formed of the active layer. The SLD region is formed of a straight and bent active layer and is 460 μm in width, the SOA region is formed of the tapered region and is 300 μm in width, and a region where propagating light is coupled with the passive waveguide is 40 μm in width.

Figure 3:
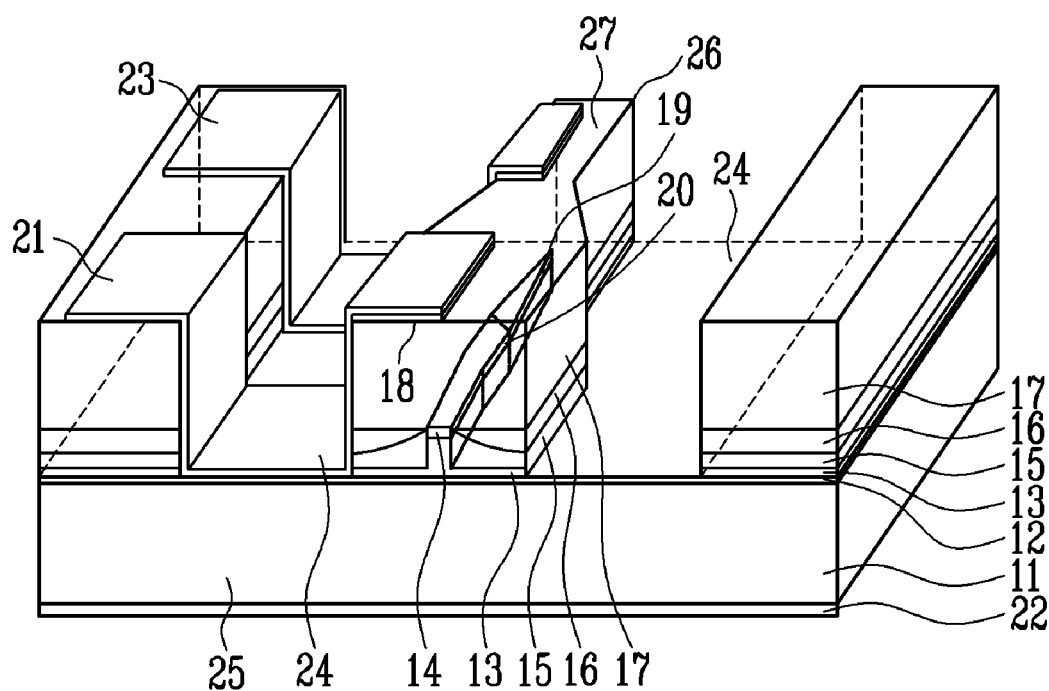
FIG. 3 is a schematic view of a 2-section SLD according to another exemplary embodiment of the present invention.

FIG. 3 is a schematic view of a 2-section SLD according to another exemplary embodiment of the present invention. The 2-section SLD in FIG. 3 is basically the same as that in FIG. 1 except that the SOA region is formed of a heterogeneous active layer.

The heterogeneous active layer has a structure in which an active layer of an SOA is grown in a butt-coupling in the SLD region, and is a bulk type structure having an oscillation wavelength similar to that of the SLD region and having no tensile strain or strain.

Figure 4:
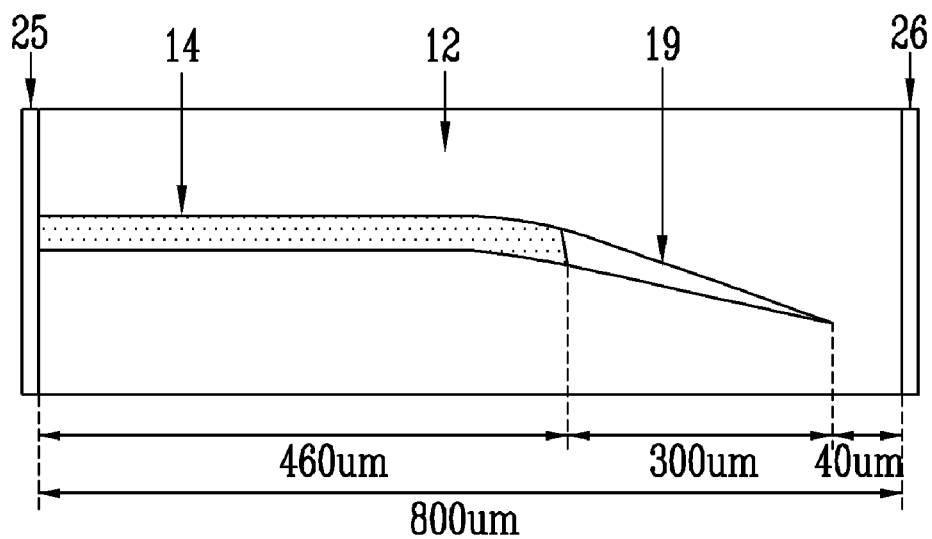
FIG. 4 is a cross-sectional view of an optical waveguide of the 2-section SLD in FIG. 3.

FIG. 4 is a cross-sectional view of the optical waveguide of the 2-section SLD in FIG. 3. Referring to FIG. 4, the 2-section SLD is basically the same as that in FIG. 2 except that the active layer in the SOA region is a heterogeneous active layer.

Figure 5:
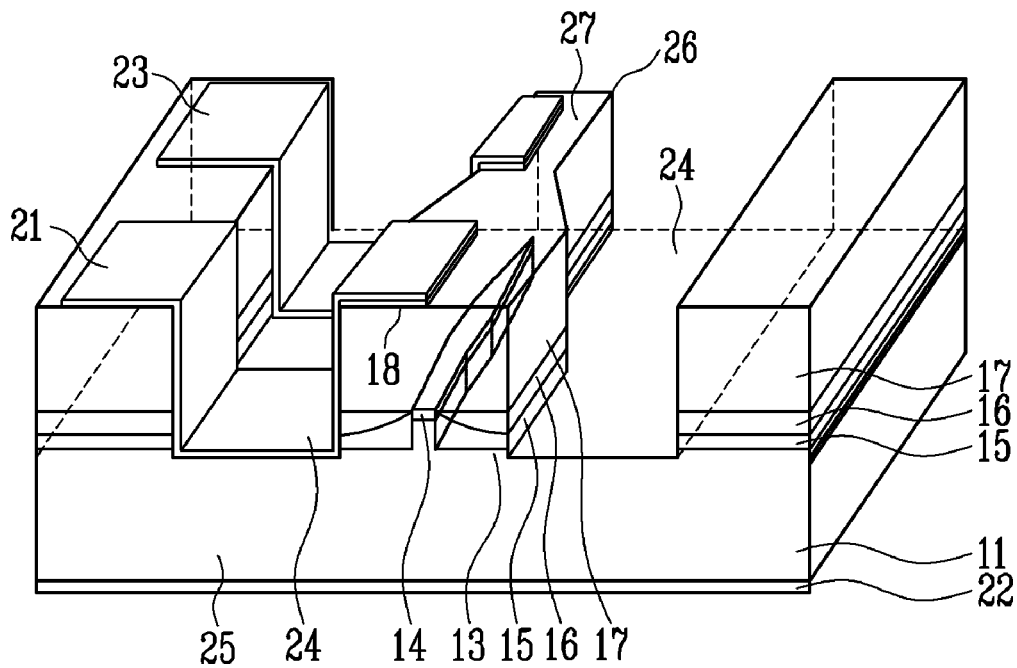
FIGS. 5 and 6 are schematic views of a 2-section SLD according to another exemplary embodiment of the present invention.
Figure 6:
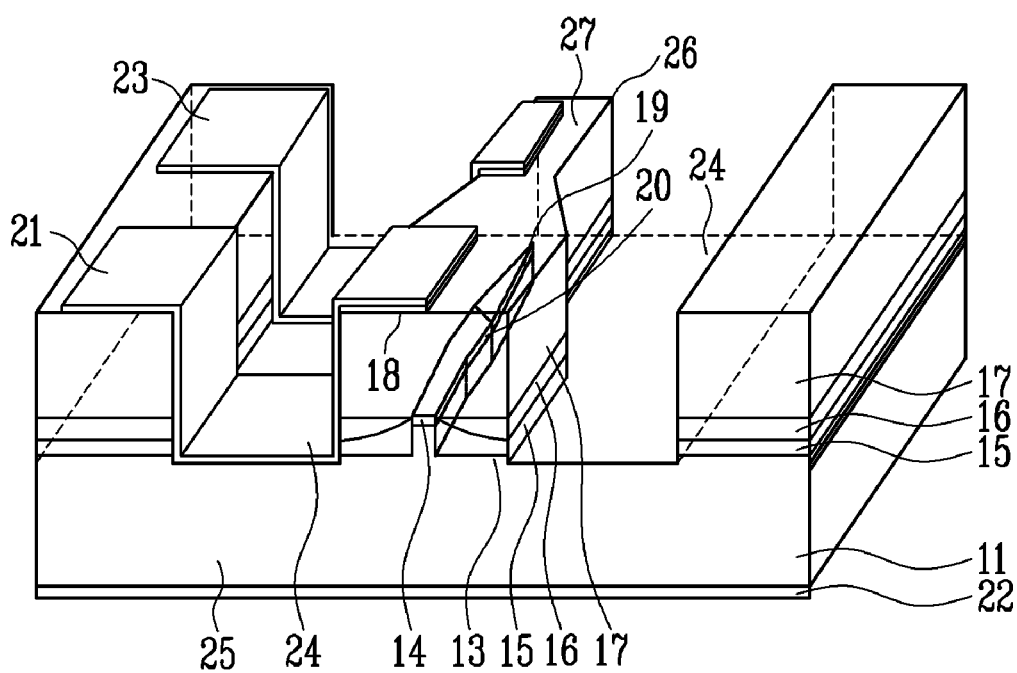

The 2-section SLDs according to the exemplary embodiments described above may be configured without the passive waveguide 12, as shown in FIGS. 5 and 6.

Referring to FIG. 5, the 2-section SLD is basically the same as that in FIG. 1. That is, the active layers in the SLD and SOA regions are homogeneous active layers without a passive waveguide.

Referring to FIG. 6, the 2-section SLD is basically the same as that in FIG. 3. That is, the active layers in the SLD and SOA regions are heterogeneous active layers without a passive waveguide.

As described above, the 2-section SLD according to the present invention may or may not include the passive waveguide 12.

Figure 7:
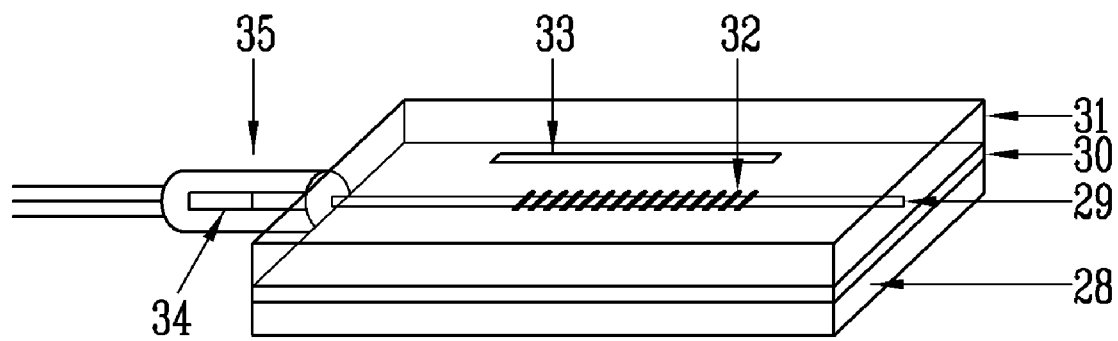
FIGS. 7 and 8 illustrate an external cavity laser using the 2-section SLD according to the present invention.

FIG. 7 illustrates an external cavity laser using the 2-section SLD according to the present invention.

Referring to FIG. 7, a TO can 35 is formed using the SOA-integrated 2-section SLD and coupled with a Bragg grating 32 formed on a silica or polymer PLC to form an external cavity laser (ECL). A heater electrode 33 is provided to control the temperature of the Bragg grating 32.

Figure 8:
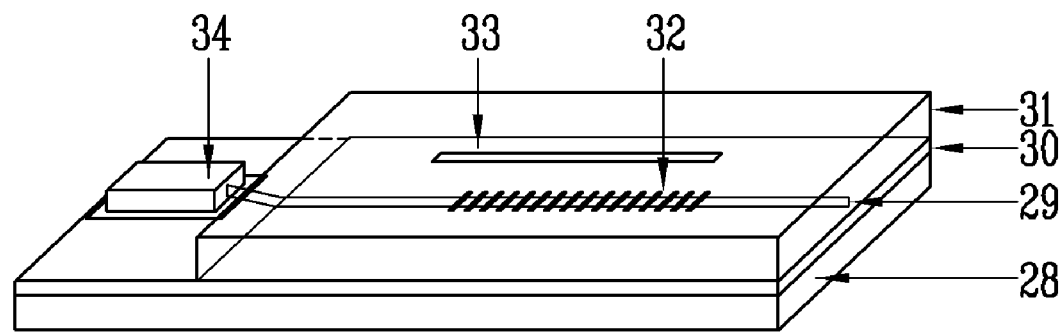

FIG. 8 illustrates another ECL using a flip-chip bonded 2-section SLD on the same PLC as that in FIG. 7.

This ECL using a 2-section SLD according to the present invention can exhibit low current and high output characteristics.

As described above, the present invention can provide a light source having a low critical current and a nearly double output of a conventional SLD by integrating an SOA into the SLD for use in a PLC-ECL.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A super luminescent diode (SLD) monolithically integrated with a semiconductor optical amplifier (SOA), comprising:
   a substrate having an SLD region and a semiconductor optical amplifier (SOA) region for amplifying light generated from the SLD region;
   an optical waveguide having a buried heterostructure, the buried heterostructure including an active layer extending over the SLD and SOA regions on the substrate and tapered in the SOA region;
   a current blocking layer formed around the active layer for blocking a current flow to layers other than the active layer, the current blocking layer including a stack of semiconductor layers having different conductivity types; and
   a clad layer formed on the optical waveguide and the current blocking layer.

2. The diode of claim 1, further comprising a passive waveguide layer formed between the substrate and the optical waveguide.

3. The diode of claim 1, wherein the active layers in the SLD region and the SOA region are heterogeneous active layers.

4. The diode of claim 1, wherein the optical waveguide is formed in a ridge structure having a narrow width in the SOA region.

5. The diode of claim 4, wherein the width of the SOA region is calculated in consideration of the size of an emissive light mode.

6. The diode of claim 1, wherein the current blocking layer has a stacked structure comprising a first conductivity type semiconductor layer and a second conductivity type semiconductor layer.

7. The diode of claim 1, wherein the active layer in the SLD region has a strain-compensated multiple quantum well (MQW) structure.

8. The diode of claim 1, wherein the active layer in the SOA region has a strain-compensated bulk structure.

9. The diode of claim 1, further comprising an ohmic layer formed on the clad layer.

10. The diode of claim 1, wherein an input surface of the SLD region has a highly reflective coating.

11. The diode of claim 1, wherein an output surface of the SOA region has a non-reflective coating.

12. The diode of claim 4, wherein the width of the ridge waveguide of the SOA region ranges from 7 to 10 µm.

13. An external cavity laser comprising the optical amplifier-integrated super luminescent diode of claim 1 mounted as a TO can in a planar lightwave circuit (PLC).

14. An external cavity laser comprising the optical amplifier-integrated super luminescent diode of claim 1 mounted as a flip-chip in a planar lightwave circuit (PLC).

15. The external cavity laser of claim 13, wherein the PLC comprises a Bragg grating formed on an optical waveguide of the PLC, and a heater electrode for controlling the temperature of the Bragg grating.

16. The external cavity laser of claim 14, wherein the PLC comprises a Bragg grating formed on an optical waveguide of the PLC, and a heater electrode for controlling the temperature of the Bragg grating.

* * * * *